US 6,548,112 B1

(12) United States Patent
Hillman et al.

(10) Patent No.: US 6,548,112 B1
(45) Date of Patent: Apr. 15, 2003

(54) APPARATUS AND METHOD FOR DELIVERY OF PRECURSOR VAPOR FROM LOW VAPOR PRESSURE LIQUID SOURCES TO A CVD CHAMBER

(75) Inventors: Joseph T. Hillman, Scottsdale, AZ (US); Tugrul Yasar, Scottsdale, AZ (US); Kenichi Kubo, Kofu (JP); Vincent Vezin, Yamanashi (JP); Hideaki Yamasaki, Nirasaki (JP); Yasuhiko Kojima, Yamanashi (JP); Yumiko Kawano, Kofu (JP); Hideki Yoshikawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/442,930

(22) Filed: Nov. 18, 1999

(51) Int. Cl.⁷ .............................................. C23C 16/18
(52) U.S. Cl. ................ 427/248.1; 427/252; 427/255.14; 427/255.23; 427/255.28; 427/907
(58) Field of Search ............................. 427/248.1, 250, 427/252, 255.14, 255.23, 255.28, 901

(56) References Cited

U.S. PATENT DOCUMENTS

| 4,678,769 A | 7/1987 | King |
| 4,954,371 A | 9/1990 | Yializis |
| 5,017,403 A | 5/1991 | Pang et al. |
| 5,173,327 A | 12/1992 | Sandhu et al. |
| 5,224,202 A | 6/1993 | Arnold et al. |
| 5,271,963 A | 12/1993 | Eichman et al. |
| 5,451,260 A | * 9/1995 | Versteeg et al. ............. 118/725 |
| 5,835,678 A | 11/1998 | Li et al. |
| 5,882,416 A | * 3/1999 | Van Buskirk et al. ....... 118/726 |
| 6,178,925 B1 | * 1/2001 | Sturm et al. ................. 122/390 |
| 6,244,575 B1 | * 6/2001 | Vaarstra et al. ............. 261/141 |
| 6,280,793 B1 | * 8/2001 | Atwell et al. ............. 427/248.4 |

FOREIGN PATENT DOCUMENTS

| EP | 0 799 907 A | 10/1997 |
| EP | 0 828 012 A | 3/1998 |

* cited by examiner

Primary Examiner—Timothy Meeks
(74) Attorney, Agent, or Firm—Wood, Herron & Evans, L.L.P.

(57) ABSTRACT

A CVD reactor is provided with a precursor delivery system that is integrally connected to the reactor chamber. Liquid precursor such as a copper or other metal-organic precursor is atomized at the entry of a high flow-conductance vaporizer, preferably with the assistance of an inert sweep gas. Liquid precursor is maintained, when in an unstable liquid state, at or below room temperature. In the vaporizer, heat is introduced to uniformly heat the atomized precursor. The vaporized precursor is passed into a diffuser which diffuses the vapor, either directly or through a showerhead, into the reaction chamber.

10 Claims, 2 Drawing Sheets

APPARATUS AND METHOD FOR DELIVERY OF PRECURSOR VAPOR FROM LOW VAPOR PRESSURE LIQUID SOURCES TO A CVD CHAMBER

This invention relates to chemical vapor deposition (CVD) and particularly to the delivery to a CVD reaction chamber of copper precursor vapor from sources.

BACKGROUND OF THE INVENTION

Chemical vapor deposition (CVD) processes such as those used in the manufacture of semiconductor devices require delivery of precursor vapor to a CVD reactor where a chemical reaction takes place that results in the deposition of a film on the semiconductor substrate. Increased demand for low resistivity contacts and interconnections has resulted in increased demand for commercial processes for depositing low loss metals such as copper, particularly for processes for forming contacts and interconnections on integrated circuits and semiconductor devices. CVD has provided a variety of processes for depositing copper as a metal for forming such integrated circuit connections.

In such CVD processes, precursors for copper are generally metal-organic liquids, most of which have very low vapor pressures. These low vapor pressure liquids must be vaporized for use in a CVD process. Such liquids, however, tend to be unstable at elevated temperatures and must be kept at or below room temperature up to the point of vaporization. The low vapor pressure of the precursors requires the vaporization chamber volume to be kept at a low pressure, in particular, at a pressure that is lower than the vapor pressure of the precursor at the vaporization temperature. Such requirements of low pressure and low temperature make it difficult to deliver the precursor vapor at a high rate and without degradation from a vaporization vessel to the reaction chamber where the CVD reaction is to take place.

As copper and other similar liquid precursors become unstable at high temperatures when in liquid state, condensation of such precursors from a vapor state produces a condensate that is also unstable. While the condensates of more conventional precursors can be easily re-evaporated, condensates of precursors, such as metal-organic precursors of copper, rapidly decompose to form solid residue on the surfaces on which they condense. Also, unless temperatures are low, such precursors undergo heterogeneous reaction at the walls of the vaporization chamber.

Many vaporizers have been made available for relatively stable, high vapor pressure precursors such as water and petroleum distillates. None, however, meets the requirements for delivering the low vapor pressure, low stability metal-organic precursors most suitable for copper CVD in semiconductor and integrated circuit manufacture.

Accordingly, there is a need for a better apparatus and method for delivery of reaction precursor vapor, particularly a vapor of a precursor having the characteristics of a metal-organic precursor of copper, to a CVD reaction chamber.

SUMMARY OF THE INVENTION

An objective of the present invention is to provide a precursor delivery system effective for reliably delivering vapor of low vapor pressure, low stability liquid precursors to a CVD chamber. A particular objective of the present invention is to deliver, from a metal-organic, particularly copper-organic, liquid precursor source, a vapor of the copper-organic or other metal-organic compound.

A further objective of the present invention is to deliver precursor vapor without decomposition of low stability, low vapor pressure precursor compounds. An additional objective is to deliver the precursor vapor without condensing the vapor in the apparatus after vaporization begins.

In accordance with certain principles of the present invention, a precursor delivery system is provided having an isothermal, high flow-conductance vaporizer that is directly integrated onto a CVD chamber. The system preferably includes a flow regulation of the liquid precursor to a high conductance vaporizer. The vaporizer is preferably configured to provide uniform thermal input to the precursor to promote efficient and repeatable vaporization. The high flow-conductance is provided which uniformly vaporizes low vapor pressure precursor liquids. The liquid remains at room temperature before vaporization, maintaining precursor liquid stability.

By "isothermal" is meant that heat is added to the precursor as it expands and is diffused into the reactor so that it neither condenses, deposits nor reacts upon entering the reactor. Otherwise, it is not necessary that the temperature of the precursor entering the reactor be held exactly constant. For copper-organic precursors, a temperature of between 60° C. and 90° C. is maintained. Further, by "high flow-conductance" is meant that low resistance is provided to the flow of the precursor into the reactor, thereby not impeding the flow and causing minimal pressure drop entering the reactor, which lessens the pressure required at the precursor source.

In accordance with preferred embodiments of the invention, a CVD processing apparatus is provided with a precursor delivery system in which liquid precursor is metered into an atomizing orifice. The metering may be carried out with a conventional metering device or other device adapted to maintain the precursor, while in a liquid state, at or below room temperature or below such other temperature at which the precursor becomes unstable or is otherwise likely to degrade.

Further, an inert gas is used as a "sweep gas", and is introduced at the atomizer at the point of vaporization of the precursor to "sweep" the atomized liquid into the vaporization chamber or volume at one end of a CVD reactor chamber. The vaporization volume is configured to provide an isothermal environment in which atomized liquid particles vaporize. The temperature of the vaporization volume is maintained high enough to prevent condensation of liquid onto walls and other structure in communication with the vaporization volume.

The sweep gas may simply be used to transport the gas into the reactor or it may be used to help atomize the liquid precursor droplets. To atomize the droplets, a heating of the sweep gas may be carried out. Such heating of the sweep gas can also serve as a way to add heat to the expanding gas, thereby facilitating the isothermal property of the delivery system.

In the certain embodiments of the invention, a low pressure environment is provided in the vaporization volume with a high vacuum conductance path maintained through the vaporization volume and into the CVD processing chamber.

The pressure of the liquid precursor into the atomizer is the pressure necessary to produce a flow rate in the range of from approximately 500 microliters per minute, plus or minus 100 $\mu$l/min, to approximately 10 milli-liters per minute.

In accordance with the preferred embodiment of the invention, liquid copper-organic precursor is introduced directly at one end of a CVD processing chamber while maintaining the precursor, while in liquid state, at or below room temperature. The liquid precursor is atomized, preferably with the assistance of an inert sweep gas such as argon, and caused to flow through a vaporizer that is designed to present a progressively expanding volume, with the atomized precursor being subjected to uniform heating as it flows through the vaporizer. The vaporizer may be a series of concentric cylinders or concentric rings of passages of progressively increasing cross-section having conductive walls for conducting heat to the vapor as it expands. Alternatively, radiant heat may be used to maintain the temperature of the expanding vapor precursor. The precursor vapor preferably passes into a diffuser in which it expands to the low density of the gas in the CVD reaction chamber. The vapor may further optionally pass through a showerhead, which provides an additional pressure drop which allows for adaptation of the delivery system to different process parameters. Where such adaptation is not needed, it is preferred that the showerhead be omitted to minimize the pressure drop during precursor delivery.

Other objectives and advantages of the present invention will be readily apparent from the following detailed description of the present invention in which:

DETAILED DESCRIPTION OF THE PREFERRED EMBODIMENTS

Figure 1:
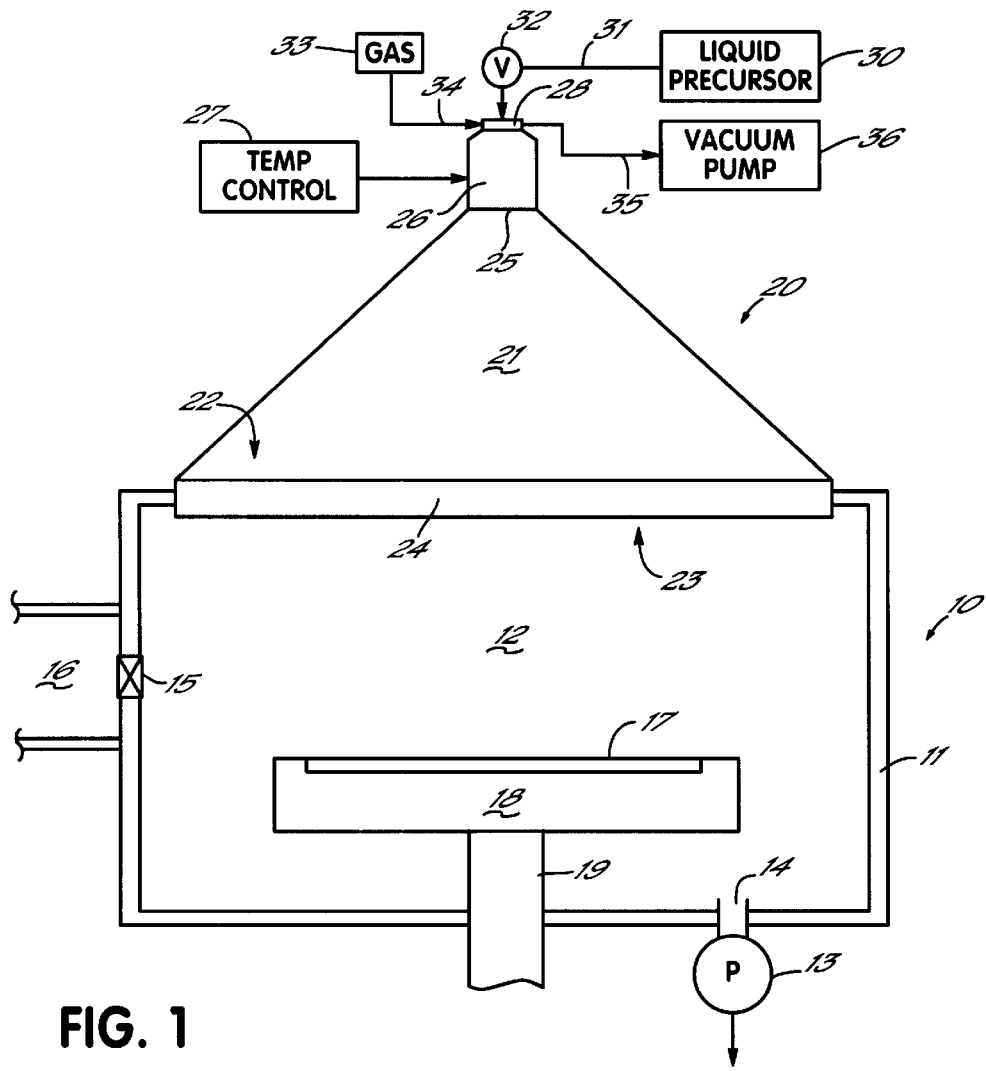
FIG. 1 is a schematic diagram of one preferred embodiment of a CVD reactor embodying principles of the present invention.

FIG. 1 diagrammatically illustrates in simplified form a chemical vapor deposition (CVD) reactor 10 according to one preferred embodiment of the invention. The reactor 10 is of a type suitable for copper CVD and includes a chamber wall 11 surrounding a CVD processing chamber 12 that is maintained at a vacuum by a pump 13 connected to an evacuation port 14 in the chamber wall 11. A slit valve 15 is provided in the chamber wall 11 for individually loading and unloading semiconductors into and out of the chamber 12 from and to a transfer module 16 of a wafer processing apparatus. A semiconductor wafer 17 is supported in the chamber 12 for processing upon a wafer support or susceptor 18, illustrated as upwardly facing supported on a pedestal 19 at the bottom of the chamber 12.

Directly integrated into the top of the CVD processing chamber 12 is a precursor vapor delivery system 20. The precursor delivery system 20 includes a diffuser 21, preferably conical in shape, and having a larger open end 22 at the bottom thereof communicating with an opening 23 in the top of the CVD chamber 12. A showerhead 24 is optionally provided at the larger end 22 of the diffuser 21 between the diffuser 21 and the CVD processing chamber 12. The diffuser 21 has a smaller upper end 25 to which is connected a high conductance vaporizer 26. A precursor temperature control system is provided which includes an isothermal heat source and temperature control 27, which may include, for example, an electric resistance heater, for subjecting the precursor in the vaporizer 26 to isothermal conversion from the liquid to the vapor state. The vaporizer 26 also has, connected at the top thereof, an atomizer 28 through which droplets or particles of precursor liquid are delivered to the vaporizer 26.

A source of liquid precursor 30 is connected through a liquid delivery line 31 to a flow control device such as a flow control valve 32 at the top of the atomizer 28. The temperature control system may include heating or cooling elements and controls to insure that liquid precursor is fed to the atomizer 28 at or below room temperature or some other temperature sufficiently low to insure that liquid precursor remains stable until vaporized. A source 33 of inert sweep gas, such as argon, is connected to an inlet port 34 of the atomizer 28. Other sweep gases can be used. For example, helium or hydrogen have been found acceptable for copper-organic precursors. The sweep gas is preferably introduced at a temperature of between 60° C. and 90° C., and at a flow rate of between 50 and 500 standard cubic centimeters per minute (sccm), preferably about 100 sccm.

The atomizer 28 is also provided with an exhaust port 35, which is optionally connected to a vacuum pump 36 to allow the flow of sweep gas from the inlet 34 to bypass the reaction chamber 12 during transient operation. The sweep gas from the inlet 34 mixes with atomized precursor liquid from the valve 32 and the mixture flows from the atomizer 28 to the vaporizer 26. The atomizer 28 may be in the form of a liquid injection and metering system of the types described in U.S. Pat. Nos. 5,361,800 and 5,204,314, and in the publication of Porter Instrument Company, Inc. of Hatfield Pennsylvania dated February 1996 and entitled "A liquid Injection System Based on a Mass Flow Controller", all of which are hereby expressly incorporated by reference herein.

Figure 2:
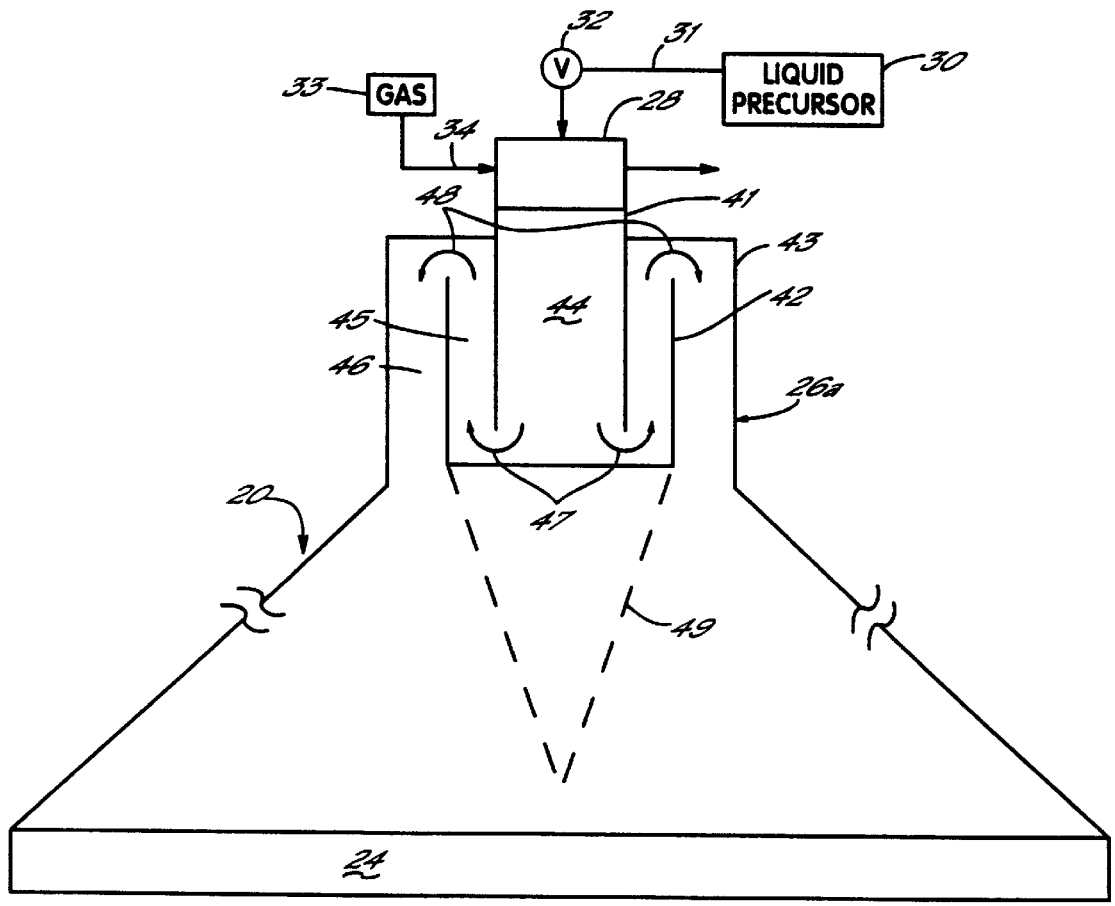
FIG. 2 is a schematic diagram of one preferred embodiment of a precursor delivery system of the CVD reactor of FIG. 1.

In one preferred embodiment, the vaporizer 26 is configured as the embodiment 26a thereof illustrated in FIG. 2. The vaporizer embodiment 26a is formed of a series of concentric cylinders 41,42,43, of progressively increasing diameters, so that the cross-sectional area of the passage into the reaction chamber 12 increases along the flow path. The number of such cylinders 41,42,43 is odd in number and shown as three, but a different number of such cylinders may be used. The cylinders 41,42,43 are connected to one another such that the atomized precursor and sweep gas mixture flows through the cylindrical central volume 44 in the smallest cylinder 41, then to the annulus 45 between the first cylinder 41 and the next largest intermediate cylinder 42, and then to the annulus 46 between the intermediate cylinder 42 and the largest outer cylinder 43, as illustrated by the arrows 47 and 48, respectively. In this way, the conductance of the vaporizer 26a is progressively increased as more atomized liquid becomes vaporized. Conical tubing can also be used to provide for the progressive increase in cross-sectional area along the precursor flow path toward the chamber 12.

Figure 2A:
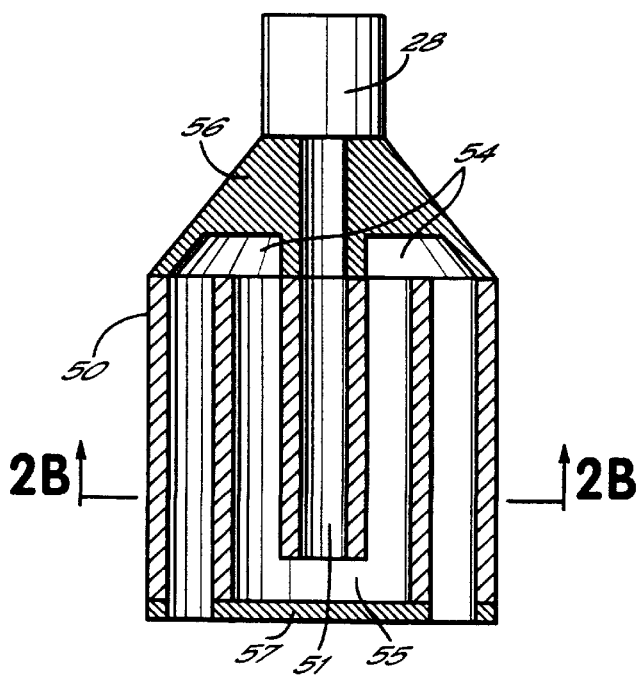
FIGS. 2A and 2B are cross-sectional views of an alternative embodiment of a vaporizer of a precursor delivery system of FIG. 2.
Figure 2B:
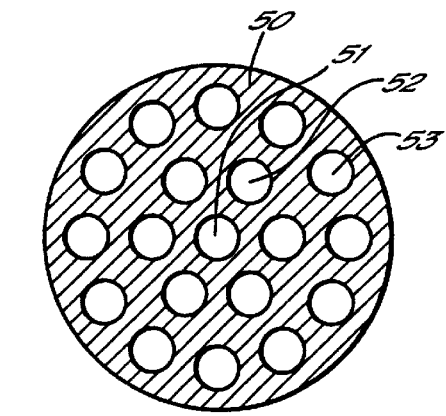

In FIGS. 2A and 2B, an alternative embodiment 26b of the vaporizer 26 is illustrated in cross-section. Where the vaporizer embodiment 26a described above is formed of a series of concentric cylinders 41–43, the vaporizer 26b is formed of a single cylindrical block 50 of metal such as aluminum. The block 50 has a central cylindrical hole 51 drilled therein that corresponds to the central volume 44 in the cylinder 41 in the embodiment 26a described above. Surrounding the hole 51 is drilled at least one intermediate ring of cylindrical holes 52, which correspond to the annular volume 45 between intermediate cylinder 42 and the inner cylinder 41 in the embodiment 26a described above. Surrounding the ring of holes 52 is drilled an outer ring of cylindrical holes 53, which correspond to the annular volume 46 between intermediate cylinder 42 and the outer cylinder 43 in the embodiment 26a described above. Radial passages 54, 55 are respectively provided in aluminum end plates 56, 57 to permit flow of vapor from the inner hole 51 to the intermediate ring of holes 52 and then to the outer ring of holes 53, from which the vapor flows into the diffuser 21. More than the three concentric flow paths, as defined by the central hole 51 and the two rings of holes 52,53, as illustrated, can be used until the desired surface area for vaporization is achieved. This vaporizer embodiment 26b, being machined from a single piece of thermally conductive metal, provides the advantage of being easier to heat uniformly.

Referring again to FIG. 2, vaporized liquid precursor flows out of the outermost annulus 46 into the interior of the diffuser 21. The region inside of the diffuser 21 is shaped to cause a uniform flow field to develop as the vapor travels from the vaporizer 26 to the opening 23. An optional inverted cone 49 is provided at the center of the annulus 46 to assist in maintaining a uniform flow from the annulus 46 into the diffuser 21. The showerhead 24 spreads and diffuses the precursor, and thereby unifies the flow front by creating a pressure drop at the opening 23 to the reaction chamber 12, which provides process latitude to adapt the diffuser 21 to more than one flow condition. This is because, without a showerhead 24, the diffuser 21 must be designed in conjunction with the vaporizer 26,26a to accommodate specific flow parameters in order to provide steady uniform flow. However, if a single set of process conditions can be specified, then the diffuser 21 can be adapted to those conditions and the showerhead 24 can usually be eliminated. Elimination of the showerhead 24 reduces the pressure in the vaporizer 12 and thereby improves the efficiency of vaporization.

Figure 3:
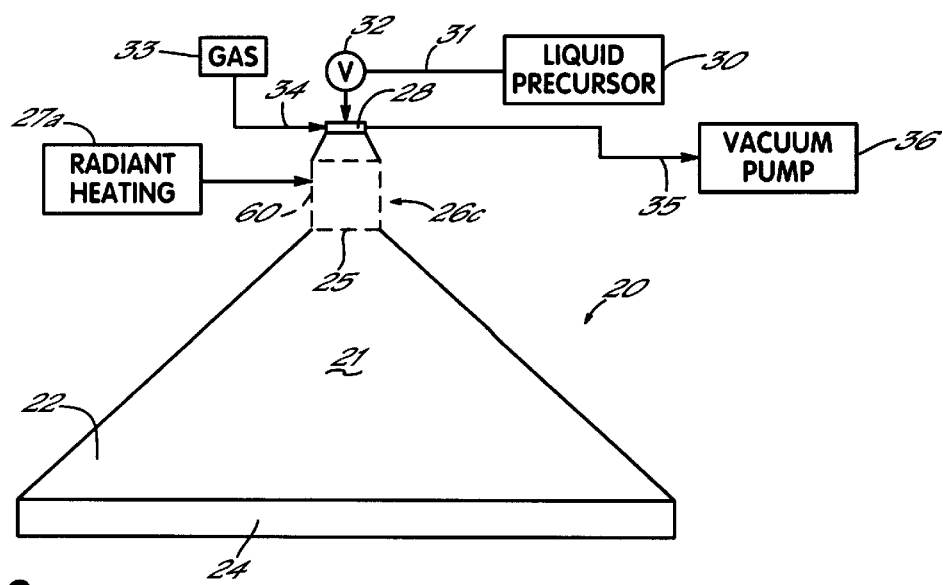
FIG. 3 is a schematic diagram similar to FIG. 2, of an alternative embodiment of the precursor delivery system of FIG. 1.

In FIG. 3, an alternative delivery system having an alternative embodiment 26c of the vaporizer 26 is illustrated. The vaporizer embodiment 26c does not rely on contact with the vaporizer wall to heat the vaporized precursor, but rather uses a cylindrical block 60 formed of a transparent material such as quartz. Heating is achieved by use of a thermal energy source and temperature control 27a that includes an infrared light source, which radiates energy through the quartz block 60, which preferably has in interior thereof formed as a conical funnel tube, to control the temperature of the vaporized precursor passing through the vaporizer 26c to the diffuser 21. The radiant heat vaporizes the atomized liquid precursor homogeneously without contact with a hot surface. The heat preferably heats the precursor to the range of from 60° C. to 90° C.

From the above description of the invention and the preferred embodiments, one skilled in the art will appreciate that variations and additions may be made to the processes and the equipment described without departing from the principles of the invention.

What is claimed is:

1. A method of delivering low vapor pressure liquid precursor vapor to a CVD processing chamber, the method comprising:

providing a source of liquid precursor at a CVD processing chamber having therein a substrate on a substrate support;

providing a vaporizer in integral communication with the processing chambers, the vaporizer having a high flow-conductance path of progressively increasing volume for atomized precursor to the processing chamber;

flowing liquid precursor from the source thereof to an atomizing device while controlling the temperature of the precursor when in the liquid state at a temperature below a temperature at which the liquid precursor is unstable;

atomizing liquid precursor at a controlled flow rate from the source and feeding the atomized precursor to an input of the vaporizer high-flow conductance path;

expanding the vaporized precursor from the vaporizer along the high flow-conductance path to the CVD processing chamber; and controlling the temperature of the expanding atomized precursor in the vaporizer high flow-conductance path.

2. The method of claim 1 further comprising:

providing a diffuser between the output of the vaporizer and the processing chamber and diffusing the vaporized precursor prior to entry into the process chamber.

3. The method of claim 1 wherein the controlling of the temperature of the precursor when in the liquid state comprises:

maintaining the temperature of the precursor when in the liquid state at a temperature below room temperature.

4. The method of claim 1 further comprising:

injecting an inert gas into the precursor and thereby sweeping atomized liquid precursor into the vaporizer.

5. A method of delivering copper precursor vapor to a CVD processing chamber according to the method of claim 1 wherein:

providing the source of liquid precursor includes providing a source of liquid copper-organic precursor;

the flowing of the liquid precursor from the source thereof is carried out while maintaining the liquid copper-organic precursor at about room temperature;

the atomizing of the liquid precursor includes atomizing the copper-organic precursor at a controlled flow rate of from about 500 μl/min to about 10 ml/min; and the controlling of the temperature of the expanding atomized precursor in the vaporizer high flow-conductance path includes maintaining the temperature of the copper-organic precursor in the vaporizer high flow-conductance path in the range of about 60° C. to about 90° C.

6. The method of claim 5 further comprising:

flowing a sweep gas at the rate of from about 50 sccm to about 500 sccm into the inlet to assist in the transfer of copper-organic precursor to the vaporizer.

7. The method of claim 1 wherein:

the controlling of the temperature of the atomized precursor in the vaporizer high flow-conductance path includes providing thermal energy to the expanding atomized precursor in the vaporizer.

8. The method of claim 1 wherein:

the controlling of the temperature of the atomized precursor in the vaporizer high flow-conductance path includes adding thermal energy to the expanding atomized precursor to maintain it at a substantially uniform temperature as it expands into the chamber.

9. A method of delivering low vapor pressure liquid precursor vapor to a CVD processing chamber, the method comprising:

providing a source of liquid precursor at a CVD processing chamber having therein a substrate on a substrate support;

providing a vaporizer in integral communication with the processing chamber, the vaporizer having a high flow-conductance path for atomized precursor to the processing chamber;

flowing liquid precursor from the source thereof to an atomizing device while controlling the temperature of the precursor when in the liquid state at a temperature below a temperature at which the liquid precursor is unstable;

atomizing liquid precursor at a controlled flow rate from the source and feeding the atomized precursor to an input of the vaporizer high-flow conductance path;

expanding the vaporized precursor to the CVD processing chamber; and controlling the temperature of the expanding atomized precursor in the vaporizer high flow-conductance path by adding heat to the precursor as it expands and is diffused into the reactor so that the precursor neither condenses, deposits nor reacts upon entering the chamber.

10. The method of claim 9 wherein:

the controlling of the temperature of the atomized precursor in the vaporizer high flow-conductance path includes adding thermal energy to the expanding atomized precursor in an amount that will maintain the precursor at a substantially uniform temperature as it expands into the chamber.

* * * * *

UNITED STATES PATENT AND TRADEMARK OFFICE
CERTIFICATE OF CORRECTION

PATENT NO.    : 6,548,112 B1
DATED         : April 15, 2003
INVENTOR(S)   : Hillman et al.

It is certified that error appears in the above-identified patent and that said Letters Patent is hereby corrected as shown below:

Column 4,
Line 33, reads "Hatfield Pennsylvania" and should read -- Hatfield, Pennsylvania --.

Column 5,
Line 46, reads "has in interior" and should read -- has an interior --.
Line 67, reads "chambers" and should read -- chamber --.

Column 6,
Line 10, reads "high-flow conductance" and should read -- high flow-conductance --.

Column 7,
Line 12, reads "high-flow conductance" and should read -- high flow-conductance --.

Signed and Sealed this

Twenty-third Day of September, 2003

JAMES E. ROGAN
*Director of the United States Patent and Trademark Office*